United States Patent
Kuo et al.

(10) Patent No.: US 6,653,951 B2
(45) Date of Patent: Nov. 25, 2003

(54) CIRCUIT AND METHOD FOR PROTECTING THE MINIMUM RUN LENGTH IN RLL CODE

(75) Inventors: Hung-chenh Kuo, Hsinchu (TW); Jing-hong Zhan, Hsinchu (TW)

(73) Assignee: Media Tek Inc., Hsin Chu (TW)

( * ) Notice: Subject to any disclaimer, the term of this patent is extended or adjusted under 35 U.S.C. 154(b) by 0 days.

(21) Appl. No.: 10/140,079

(22) Filed: May 8, 2002

(65) Prior Publication Data

US 2002/0180624 A1 Dec. 5, 2002

(30) Foreign Application Priority Data

May 10, 2001 (TW) ........................................ 90111188 A

(51) Int. Cl.[7] .............................................. H03M 13/12

(52) U.S. Cl. ........................... 341/59; 341/94; 714/796; 369/59.19

(58) Field of Search ..................... 341/59, 94; 375/262, 375/341; 714/795, 796; 360/40; 369/59.19

(56) References Cited

U.S. PATENT DOCUMENTS

| | | | | |
|---|---|---|---|---|
| 5,901,128 A | * | 5/1999 | Hayashi et al. | 369/59 |
| 2002/0067677 A1 | * | 6/2002 | Miyashita et al. | 369/59.16 |

* cited by examiner

*Primary Examiner*—Howard L. Williams
(74) *Attorney, Agent, or Firm*—Birch, Stewart, Kolasch & Birch, LLP

(57) ABSTRACT

A circuit and method for protecting the minimum run length in RLL code is disclosed. The circuit comprises three state processors, each having a plurality of registers, including a decision bit, an invalid bit, metric bits and path bit array, and changing state at the zero crossing point (Turning) of an RF signal, before the zero crossing point (Before) and after the zero crossing point (After). A metric computing unit is used to calculate the metrics at the points of turning, before and after corresponding to the EFM (Eight-Fourteen Modulation) signal. A timing unit is used to generate control signals to the state processors and metric computing unit according to the EFM signal. Then the protecting circuit comprises a computing unit to control the decision bit, the invalid bit, the metric bits and path bit array and generates correct output signals according to the control signals and the metrics.

12 Claims, 10 Drawing Sheets

CIRCUIT AND METHOD FOR PROTECTING THE MINIMUM RUN LENGTH IN RLL CODE

BACKGROUND OF THE INVENTION

1. Field of the Invention

The invention relates to a circuit and method for protecting the minimum run length in RLL code, and more specifically to a protection circuit and method using three states (Before, Turning, and After) to compute the valid path satisfying the minimum run length limited in RLL code.

2. Description of the Related Art

In general, an optical disk driver uses a slicer to convert RF signals into EMF (Eight to Fourteen Modulation) signals. Because the RF signal usually includes noises, the slicer sometime generates error EMF signals. For example, the minimum run length limited of EFM signal is 3T, but an error EFM signal may be only 2T or 1T. Therefore, a protection circuit is needed to restore the error EFM signal of 2T or 1T to a correct EFM signal with 3T. Currently, a Viterbi decoder is used to decode the correct EFM signal.

According to the Viterbi algorithm, it is necessary to compute the signal information contained in each survive path in order to generate total path metrics. At last, the survive path with minimum total path metric is selected to serve as a correct path, and then the correct EFM signal is found by way of reverse-derivation. However, when the CD/DVD optical disk driver system does not utilize the A/D converter but the slicer to convert the RF signal into the EFM signal, the information of the system with respect to the RF signal is focused on the zero crossing point. At this time, even though the decoder used by the Viterbi algorithm may still be included, many elements in the decoder are not be used. Consequently, the unused elements in the decoder can be eliminated from the original Viterbi decoder, thereby lowering the cost thereof.

SUMMARY OF THE INVENTION

In view of the above-mentioned problems, an object of the invention is to provide a simplified circuit and method for protecting the minimum run length in RLL code, wherein the minimum run length is protected by founding the optimum path according to the metrics of the states and other information at the zero crossing point (Turning), before the crossing point (Before), and after crossing point (After).

To achieve the above-mentioned object, a circuit for protecting minimum run length in RLL code is provided. The circuit operates in three states before, during, and after turning of the RF signals to find the optimum path to protect the minimum run length in RLL code. The protection circuit includes three state processors, a metric computing unit, a timing control unit, and an operation unit. Each of the state processors includes a decision bit, an invalid bit, a metric bit, and bit arrays of survive paths, and operates according to the control signals of before, during, and after turning states. The metric computing unit computes metrics of the EFM signals with respect to the turning states of before, during, and after. The timing control unit generates the control signals according to the EFM signals and outputs to the three state processors and the metric computing unit. The operation unit controls the decision bit, the invalid bit, the metric bit, and the bit arrays of survive paths of the state processors according to the control signals generated by the timing control unit and the three metrics computed from the metric computing unit, and generates correct output signals.

Consequently, the invention finds the optimum path to protect the minimum run length in RLL code by the tree state processors in conjunction with the limitations of the three turning states of during, before, and after.

DETAILED DESCRIPTION OF THE INVENTION

The circuit and method for protecting the minimum run length in RLL code of the present invention will be described with reference to the accompanying drawings.

Figure 1:
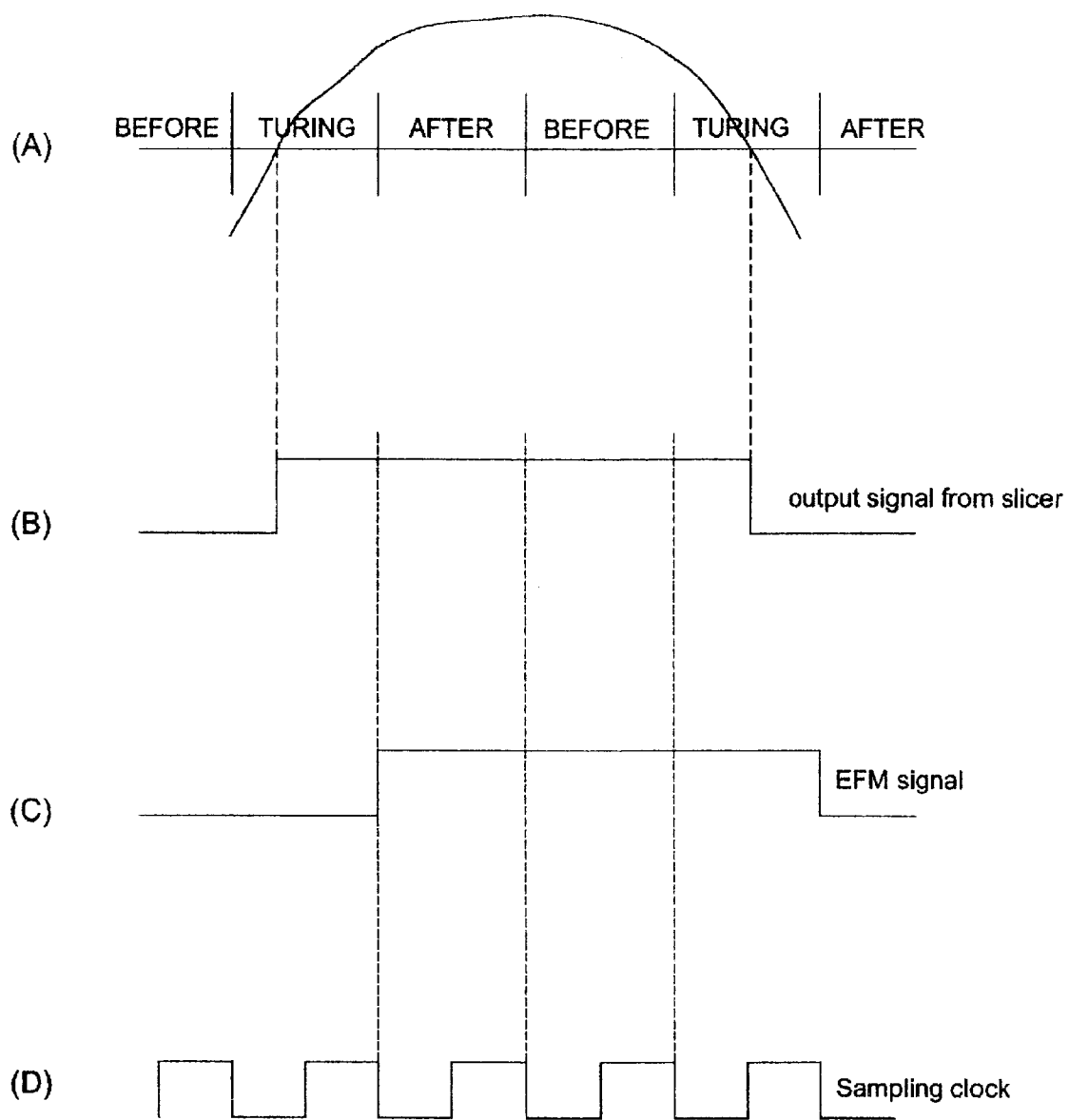
FIG. 1 shows the waveforms of the RF signal and the output signals after the RF signal is converted and sampled by the slicer, wherein (A) depicts the RF signal, (B) depicts the output signal from slicer, (C) depicts the EFM signal, and (D) depicts the sampling clock.

FIG. 1 shows the waveforms of the RF signal and the output signals after the RF signal is converted and sampled by the slicer, wherein (A) depicts the RF signal, (B) depicts the output signal form slicer, (C) depicts the EFM signal, and (D) depicts the sampling clock. If the noises of the system are not very serious and the position of the zero crossing point of the RF signal does not drift over 1T (the width of each EFM signal), there are three possibilities with respect to the position of the zero crossing point. That is, the zero crossing point may be positioned at the crossing point (turning), 1T before or 1T after the crossing point, as shown in FIG. 1(A).

FIG. 2 shows the trellis diagrams of the invention in various conditions, wherein (A) depicts the trellis diagram when the length for all EFM signals are 3T, (B) depicts the trellis diagram when the length of one of the EFM signals is 2T, and (C) depicts the trellis diagram when the length of one of the EFM signals is 1T. In the trellis diagram as shown in FIG. 2, the so-called Before, Turning, and After represent three intervals corresponding to Before, Turning, and After in FIG. 1(A), respectively. Each circle represents the state after the process during the corresponding interval. The P0, P1, and P2 within the circles represent three state processing units, respectively. The bold lines in FIG. 2 represent the valid paths. According to the waveform of FIG. 1(A), if the system noise are not very serious and the position of the zero crossing point of the RF signal does not drift over 1T, the turning process may only occur at turning point, before the turning point, or after the turning point.

Figure 2A:
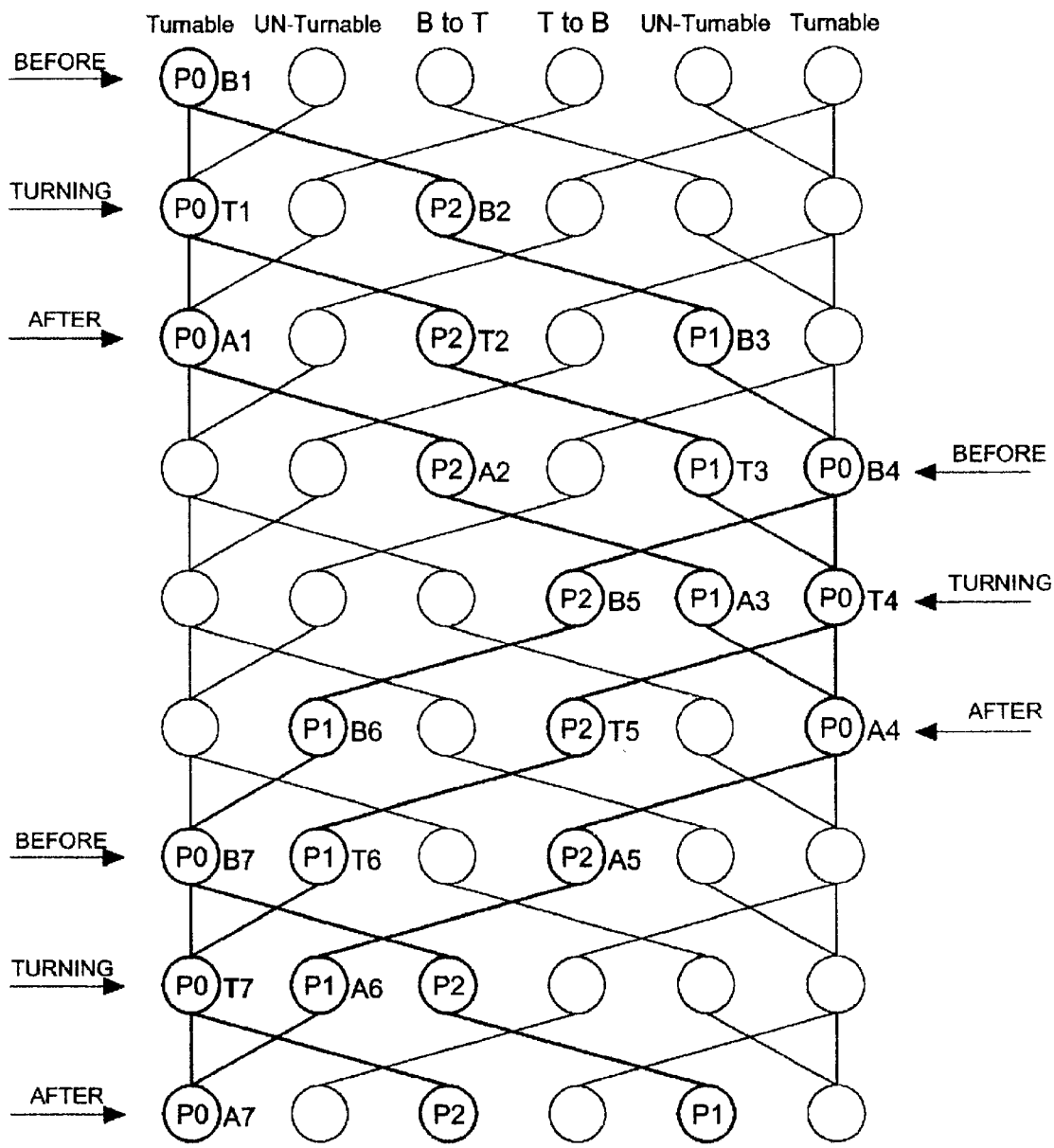
FIGS. 2(A)–2(C) shows the trellis diagrams of the invention in various conditions, wherein (A) depicts the trellis diagram when all of the EFM signals are 3T, (B) depicts the trellis diagram when one of the EFM signals is 2T, and (C) depicts the trellis diagram when one of the EFM signals is 1T.

As shown in FIG. 2(A), since each of the sampled EFM signals is 3T, the EFM signals are regarded as normal and there are three valid paths extending downward.

Figure 2B:
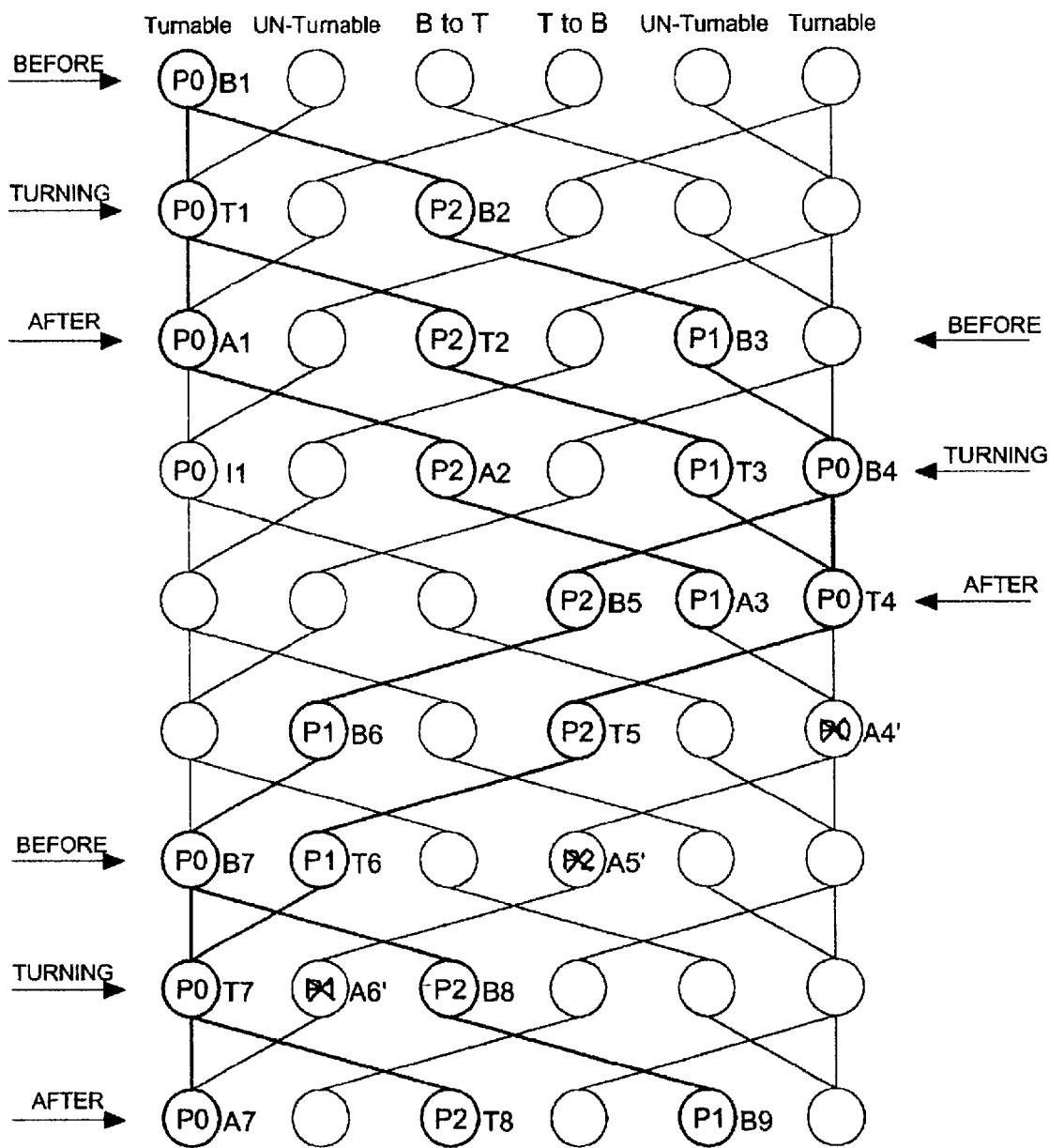

As shown in FIG. 2(B), it is assumed that the first turning is at an initial state, and there are three valid paths extending downward. However, the distance between the first turning point T1 and second turning point B4 is only 2T. According to the condition of the run length limited, only at the turning point or 1T before the turning point or 1T after the turning point is at the valid turning state. The point A4' is positioned 2T after the turning point, so the state at position A4' is marked as invalid state. Consequently, there are only two valid paths after the second turning, as shown in FIG. 2(B).

Figure 2C:
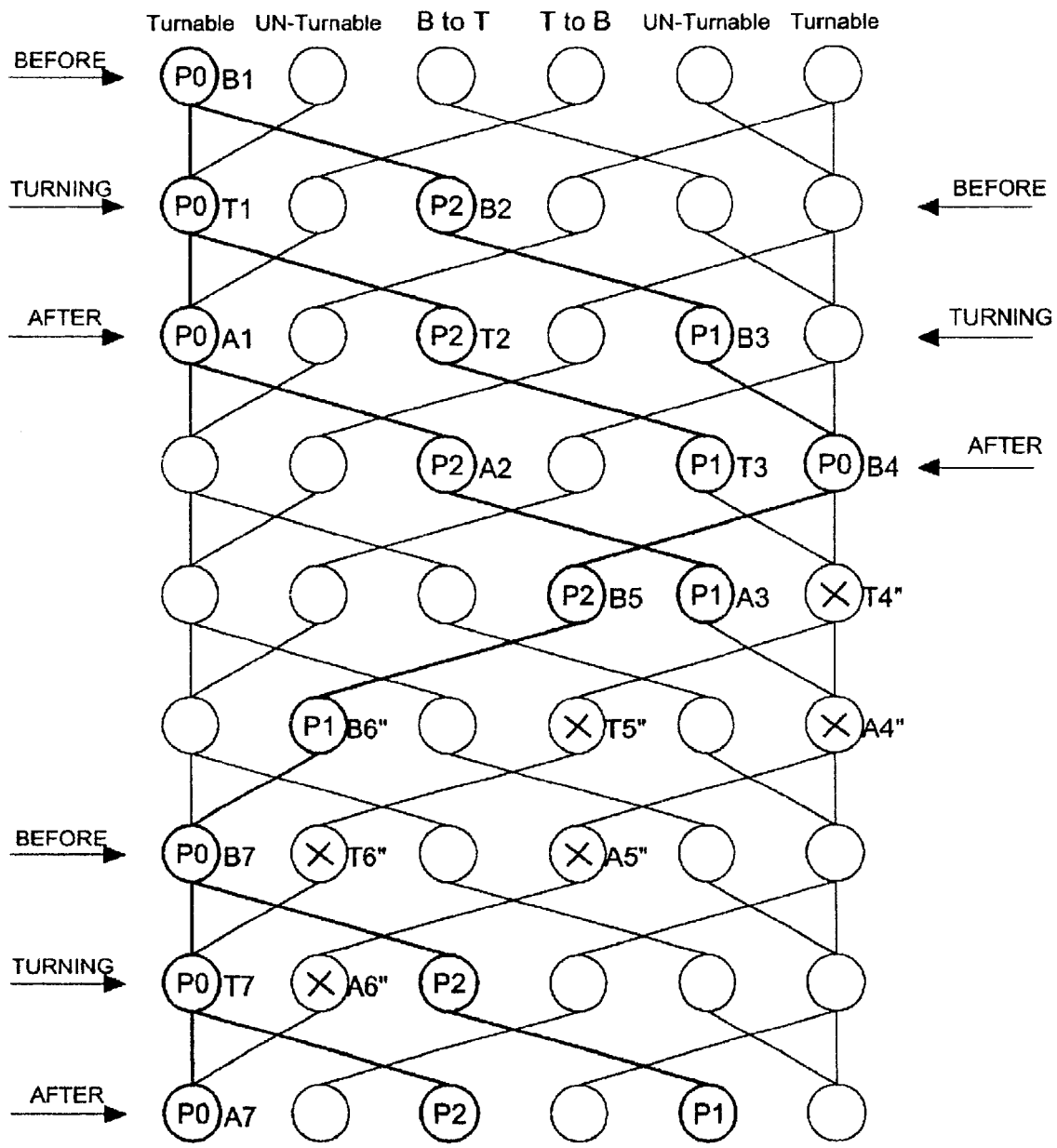

As shown in FIG. 2(C), it is assumed that the first turning is at an initial state, and there are three valid paths extending downward. However, the distance between the first turning point and second turning point is only 1T. According to the condition of the run length limited, only at the turning point or 1T before the turning point or 1T after the turning point is at the valid turning state. The T4" is positioned 2T after the turning point and the A4" is positioned 3T after the turning point, so the states of T4" and A4" are marked as invalid state. Consequently, there is only one valid path after the second turning, as shown in FIG. 2(C).

According to the trellis diagram of FIG. 2, it is clear that the method of the invention can restore the RLL code smaller than 3T to the RLL code equal to 3T.

Figure 3:
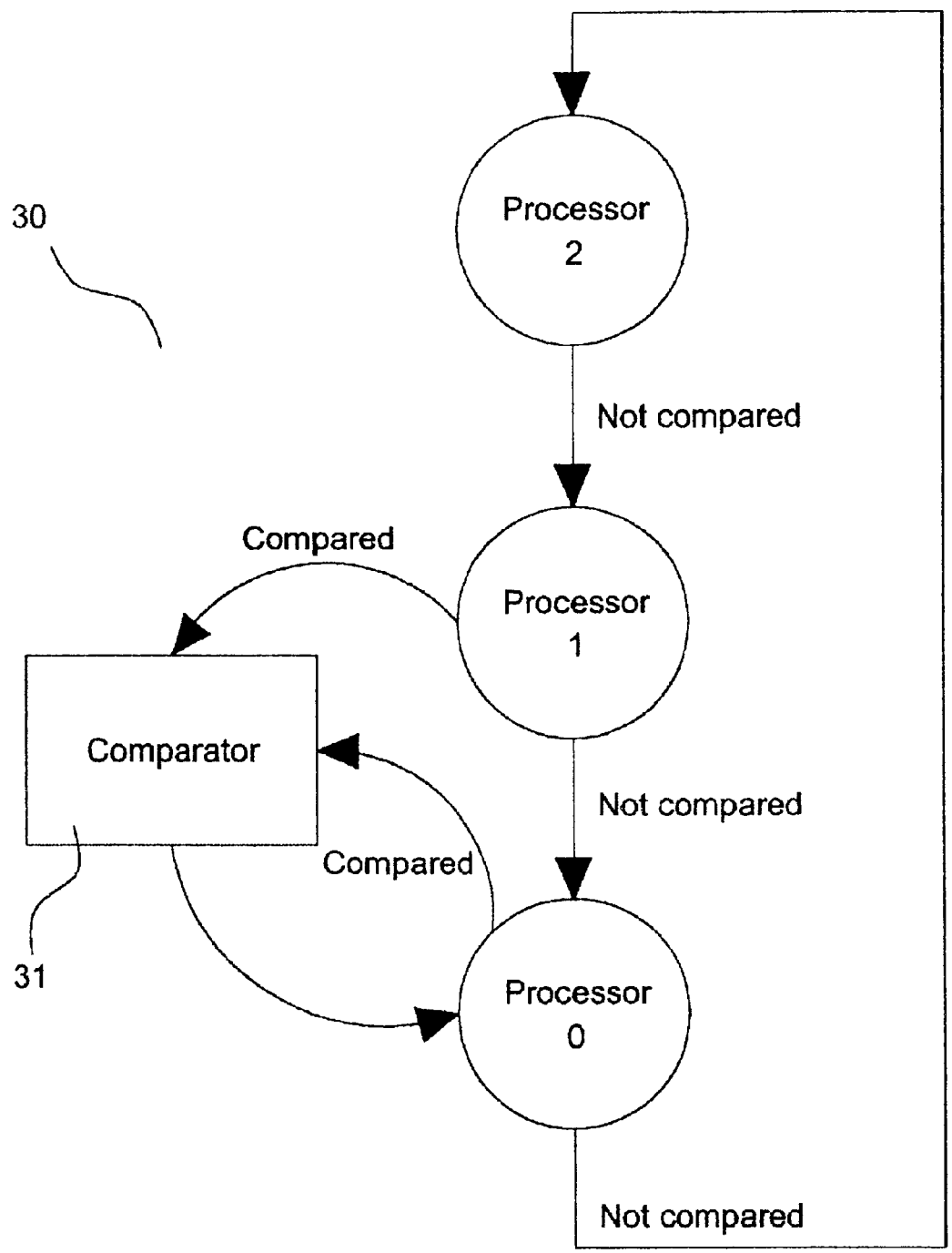
FIG. 3 is an architecture diagram showing the data flow for protection the minimum run length in RLL code of the present invention.

FIG. 3 is an architecture diagram showing the data flow for protecting the minimum run length in RLL code of the present invention. Referring to FIG. 3, the circuit 30 for protecting the minimum run length in RLL code of the present invention includes three state processors P0, P1, P2, and a comparator 31. Each state processor includes a decision bit DB, a metric bit MB, an invalid bit IB, and a path bit array BA. When data are transferred from a state processor to another one, the decision bit DB, the metric bit MB, the invalid bit IB, and the path bit array BA will also be transferred to another state processor. The comparator 31 compares two sets of metric bits MB, and transfers the data having a smaller metric bit MB to the state processor P0.

As shown in FIG. 3, the related data from the state processor P0 are directly transferred to the state processor P2 without comparing the metric bit MB of the state processor P0 with that of the state processor P2. Similarly, the related data from the state processor P2 are directly transferred to the state processor P1 without comparing the metric bit MB of the state processor P2 with that of the state processor P1. Obviously, the metric bits MB of the state processors P0 and P1 have to be compared only when the data are transferred from the state processor P1 to the state processor P0.

Since the circuit for protecting the minimum run length in RLL code of the invention only utilizes three state processors P0, P1 and P2 to process the changes between various states, some limitations and judging rules have to be accompanied. The limitations and rules of the invention are described as follows.

1. The system noise is not very serious and the position of the zero crossing point of the RF signal does not shift over 1T. In this state, only the states at turning, 1T before the turning point and 1T after the turning point have to be considered, and other states need not to be considered.

2. The decision bit DB is changed only when data are transferred from the state processor P0 to the state processor P2. That is, the decision bit DB is set to 1 when B to T is performed, and is set to 0 when T to B is performed.

3. The invalid bit IB is transferred downward.

4. The invalid bit IB is set to be 1 when the decision bits DB are not the same.

The operation processes of the invention are described with reference to FIGS. 2(B) and 3, wherein each state corresponds to the time of 1T.

State 1

As shown in FIG. 2(B), the state point B1 at the before interval is processed by the state processor P0 (B1).

State 2

The state is changed from the before interval to the turning interval. The state processor P0 (B1) transfers data to the state processor P2 (B2) and sets the decision bit DB to 1 at the same time. Meanwhile, the comparator 31 compares the metric bit MB of the state processor P0 with that of the state processor P1, and transfers data with smaller metric bit MB and an invalid bit IB of 0 to the state processor P0 (T1). In this embodiment, the data from the state processor P0 (B1) are transferred to the state processor P2 (B2).

State 3

The state is changed from the turning interval to the after interval. The state processor P2 (B2) transfers data to the state processor P1 (B3), and the state processor P0 (T1) transfers data to the state processor P2 (T2) at the same time. The comparator 31 compares the metric bit MB of the state processor P0 with that of the state processor P1, and transfers the data with smaller metric bit MB and an invalid bit of 0 to the state processor P0 (A1). In this embodiment, the data in the state processor P0 (T1) are transferred to the state processor P0 (A1).

State 4

The state changes from the after interval to the turning interval. As shown in FIG. 2(B), owing to the influence of noises, the distance between the first turning state and second turning state is only 2T. Therefore, according to FIG. 3, the state processor P2 (T2) transfers data to the state processor P1 (T3), while the state processor P0 (A1) transfers data to the state processor P2 (A2). At this time, since the state is out of or over the after interval, the state processor P0 is marked as an invalid bit after the data are shifted out to it-self. Consequently, the state processor P1 (B3) transfers data to the state processor P0 (B4) directly.

State 5

The state changes from the turning interval to the after interval. The state processor P2 (A2) transfers data to the state processor P1 (A3), while the state processor P0 (B4) transfers data to the state processor P2 (B5). The comparator 31 compares the metric bit MB of the state processor P0 with that of the state processor P1 (B3), and transfers data smaller metric bit MB from the state processor to the state processor P0 (T4).

State 6

The state processor P2 (B5) still transfers data to the state processor P1 (B6) while the state processor P0 (T4) transfers data to the state processor P2 (T5). However, since the state is out of or over the after interval, the state processor P0 (T4) is marked as the invalid bit after data are shifted out to it-self (A4'). Therefore, the data are transferred from the state processor P1 (A3) to the state processor P0 (A4'). However, the decision bit DB of the state processor P0 is 1, and that of the state processor P2 is 0. Thus, the invalid bit IB of the state processor P0 (A4') is set to be 1.

State 7

The state enters the before interval. At this time, the state processor P2 (T5) still transfers data to the state processor P1

(T6), while the state processor P0 (A4') transfers data to the state processor P2 (A5'). However, since the invalid bit IB of the state processor P0 (A4') is 1, the invalid bit IB of the state processor P2 (A5') is also 1. The state processor P1 (B6) transfers data to the state processor P0 (B7) without the comparison process of the comparator.

State 8

The state enters the turning interval. At this time, the state processor P2 (A5') transfers data to the state processor P1 (A6'). Since the invalid bit IB of the state processor P2 (A5') is 1, the invalid bit IB of the state processor P1 (A6') is also 1. Meanwhile, the state processor P0 (B7) transfers data to the state processor P2 (B8). Subsequently, the comparator 31 compares the metric bit MB of the state processor P0 with that of the state processor P1, and transfers the data with smaller metric bit MB from the state processor to the state processor P0 (T7).

State 9

The state enters the after interval. At this time, the state processor P2 (B8) transfers data to the state processor P1 (B9), while the state processor P0 (T7) transfers data to the state processor P2 (T8). Next, since the invalid bit IB of the state processor P1 (A6') is 1, the state processor P0 (T7) transfers data to the state processor P0 (A7).

The trellis diagram as shown in FIG. 2(C) is similar to that as shown in FIG. 2(B). The only difference therebetween resides in that the distance between the first turning and the second turning is 1T. Therefore, there is only one valid path after the second turning, and the other two paths are configured to be invalid paths. However, the data are further transferred to the other paths via the valid path after the third turning, and the normal state is further restored.

Since the above-mentioned limitations are followed, as shown in FIGS. 2(B) and 2(C), there are only three state processors P0, P1 and P2 needed for processing various states. Meanwhile, the RLL code smaller than 3T can be restored to the RLL code equal to 3T.

Figure 4:
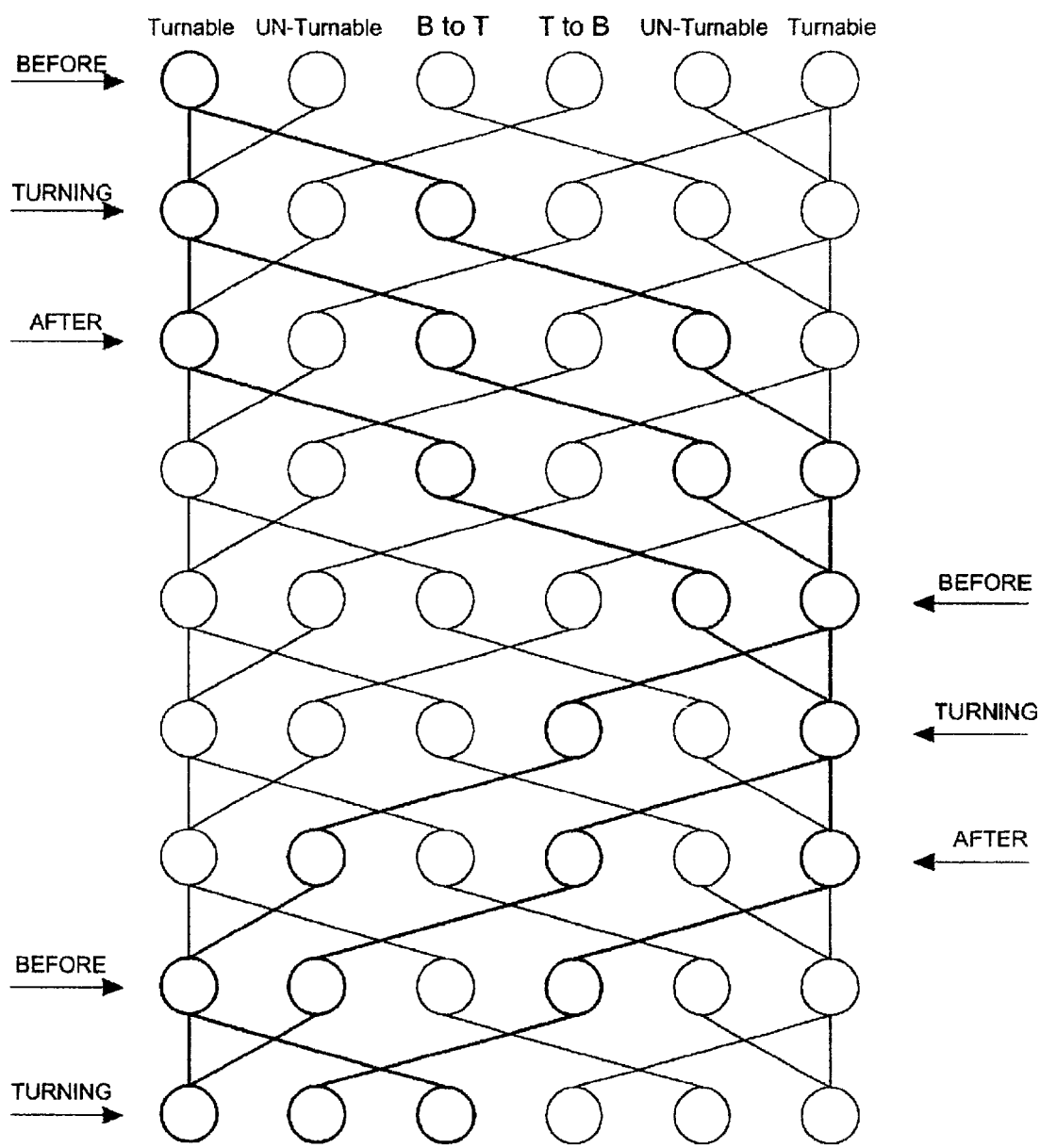
FIG. 4 is a trellis diagram showing the condition where the distance between two turning points is 4T in this present invention.

FIG. 4 is a trellis diagram showing the condition in the present invention where the distance between two turning points is 4T. As shown in this drawing, since the turning point extends backward, the valid paths also extend backward. In order to prevent the previous errors from being transferred backward, the metric bit MB of each state processor is reset or set to be 0 when the state equal to greater than 4T occurs.

Figure 5:
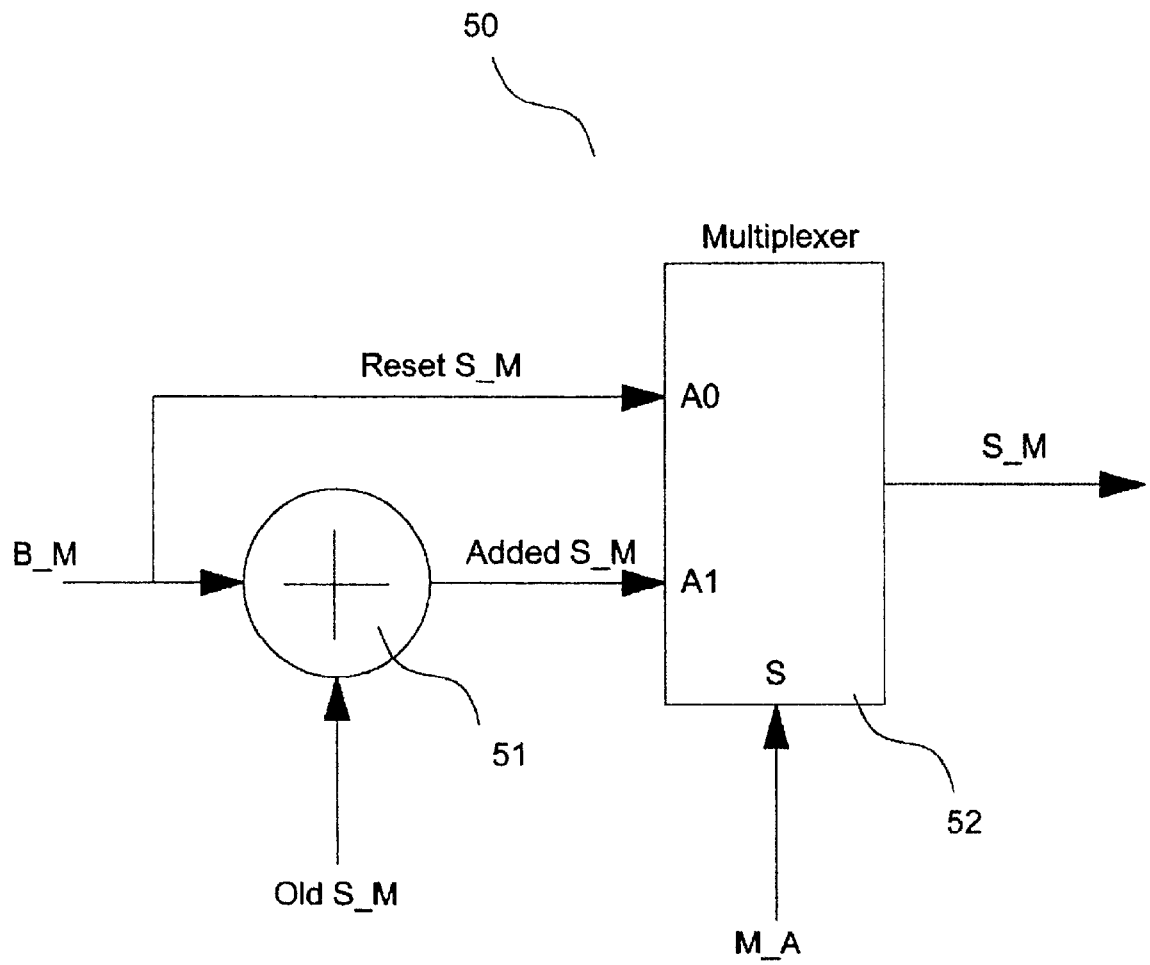
FIG. 5 shows a computing unit of the invention for computing the survivor metric S_M.

FIG. 5 shows a computing unit of the present invention for computing the survivor metric S_M. As shown in this drawing, the computing unit 50 includes an adder 51 and a multiplexer 52. The adder 51 adds the branch metric B_M to the old survivor metric S_M to generate a new survivor metric, and outputs the new survivor metric to the multiplexer 52. The multiplexer 52 outputs the branch metric B_M or new survivor metric S_M according to a reset signal M_A. When the turning metric is 3T or less than 3T, the branch metric B_M is the metric of this state and the reset signal M_A of the multiplexer 52 is 0. Accordingly, the multiplexer 52 outputs the new survivor metric S_M. When the turning distance is 4T or greater than 4T, the branch metric B_M is 0, and the reset signal M_A of the multiplexer 52 is 1. Therefore, the multiplexer 52 outputs 0 as the new survivor metric S_M, and the new survivor metric S_M is accordingly reset.

Figure 6:
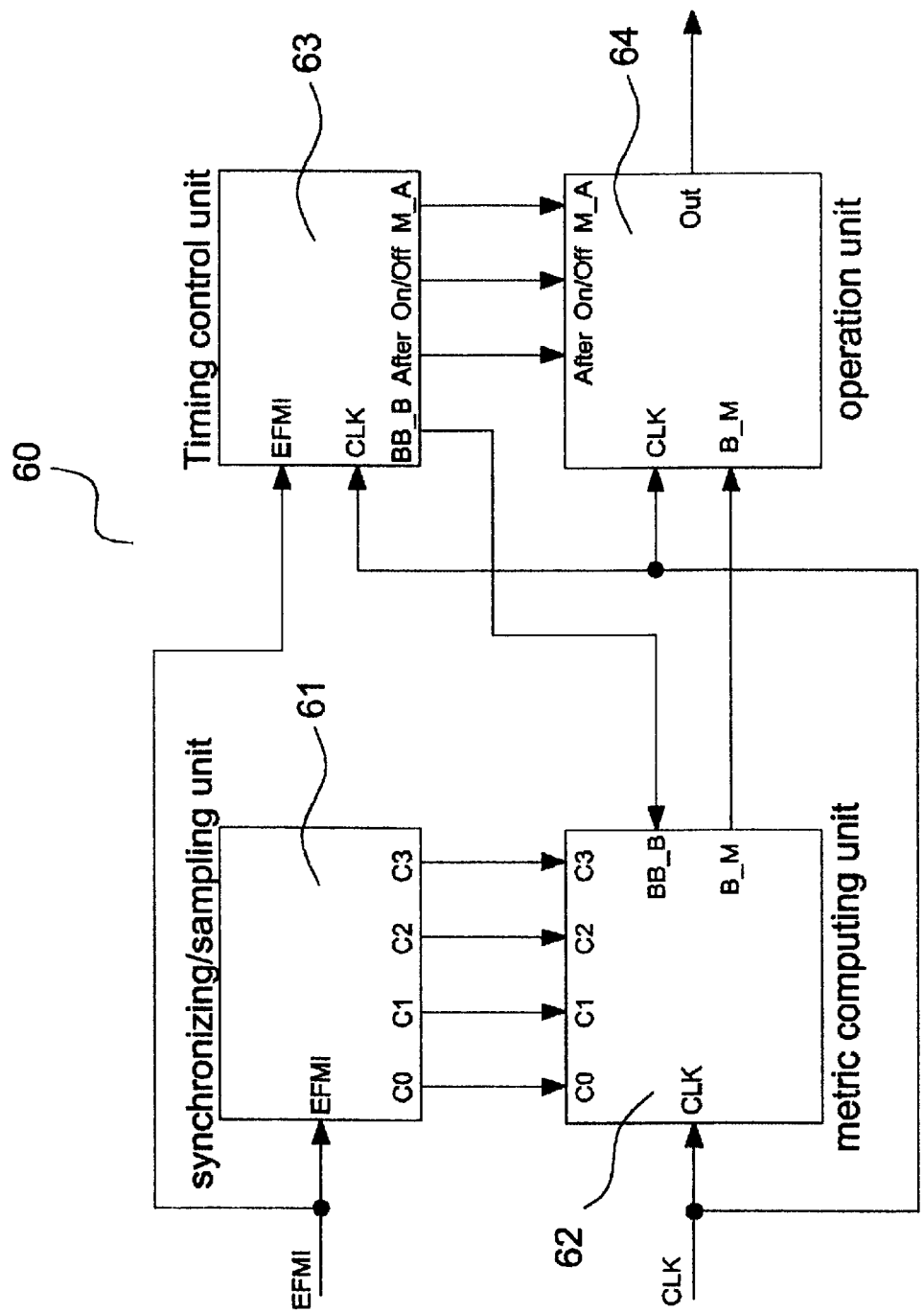
FIG. 6 is a block diagram showing the circuit for protecting the minimum run length in RLL code of the present invention.

FIG. 6 is a block diagram showing the circuit for protecting the minimum run length in RLL code of the present invention. Referring to FIG. 6, the control unit 60 of the circuit for protecting the minimum run length includes a synchronizing/sampling unit 61, a metric computing unit 62, a timing control unit 63, and an operation unit 64. The control unit 60 controls the operations of the three state processors P0, P1, and P2.

The synchronizing/sampling unit 61 samples the EFMI signals according to a sample clock and outputs the signals C0, C1, C2 and C3 of four quadrants. The frequency of the sample clock is higher than that of the EFMI signal, and equals to four times of that of the EFMI signal. Of course, the sample clock having the frequency that is other times of that of the EFMI signal may also be used in this invention. The reason for using the synchronizing/sampling unit 61 to sample the EFMI signals into the signals C0, C1, C2 and C3 of four quadrants in this invention is to compute the metric by the signals C0, C1, C2 and C3.

The metric computing unit 62 computes the metric according to the signals C0, C1, C2 and C3. As shown in FIG. 6, the metric computing unit 62 receives the signals C0, C1, C2 and C3, and a synchronizing signal BB_B generated from the timing control unit 63. One example of the metric computing method of the present invention utilizes the synchronizing/sampling unit 61 to sample the EFMI signal and to output the signals C0, C1, C2 and C3 of four quadrants. Subsequently, the difference values between the sampled signal and the standard signals before, during and after the turning are computed as the metrics. In this embodiment, the standard signals for the before, during, and after the turning are "001111111111", "000000111111", and "000000000011", respectively. If the sampled signal is "000001111111", the metrics for the before, during and after the turning are 1, 3 and 5, respectively. Of course, other metric computing methods may also be used in this invention.

Figure 8:
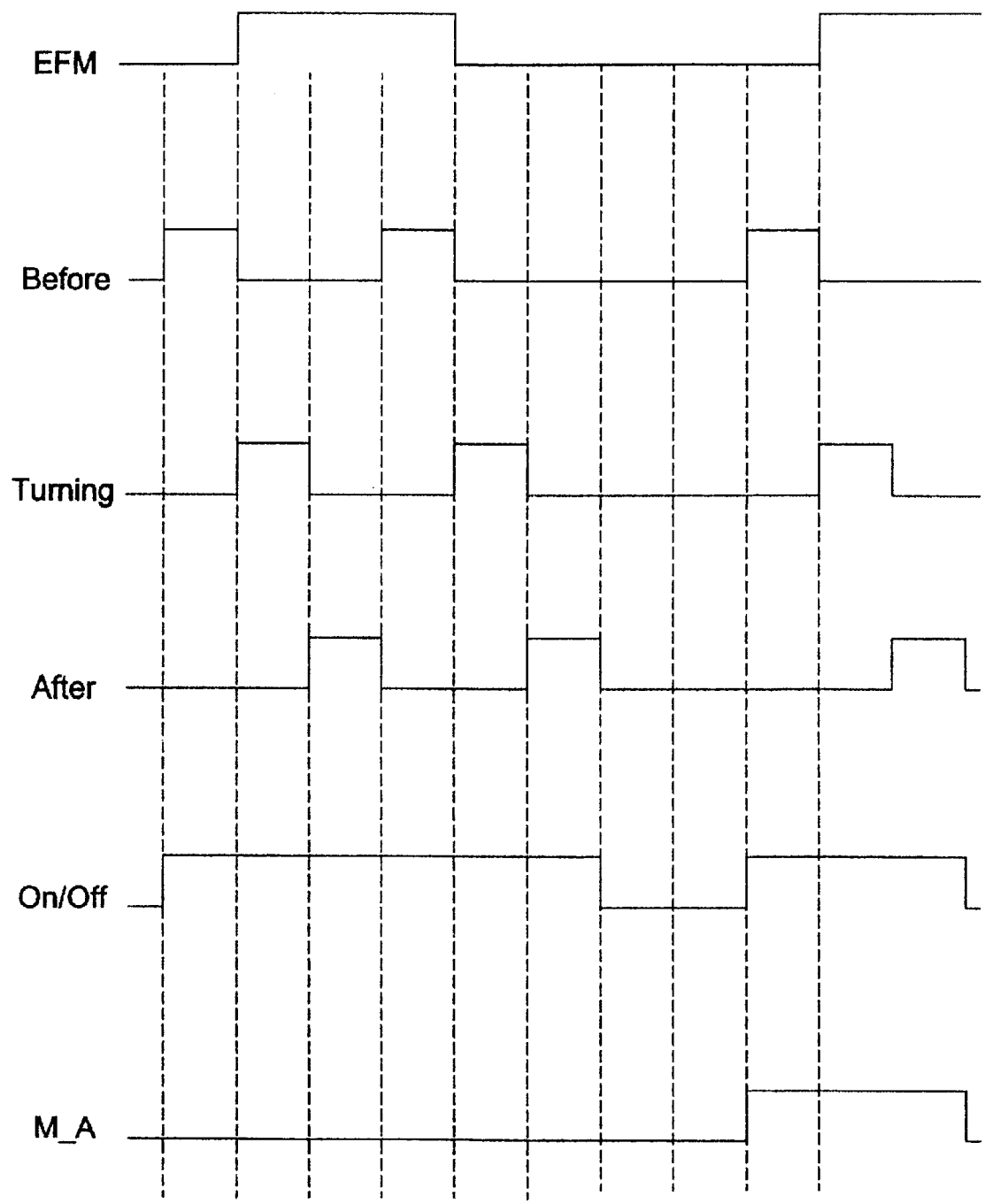
FIG. 8 shows the waveforms of the control signals and EFM signal of the timing control unit in FIG. 6.

The timing control unit 63 generates the control signals according to the EFMI signals. The control signals include the synchronizing signal BB_B, the signal "Before" for the before turning, the signal "Turning" for the during turning, the signal "After" for the after turning, the switching signal On/Off, and the reset signal M_A. The synchronizing signal BB_B is set to H at the time of 3T before the turning point of the EFMI signal. The signal "Before" is set to H at the time of 1T before the turning point of the EFMI signal. The signal "Turning" is set to H at the time of 1T at the turning point of the EFMI signal. The signal "After" is set to H at the time of 1T after the turning point of the EFMI signal. The switching signal On/Off is L when the control signals "Before", "Turning", and "After" are all L. Next, when the turning point of the EFMI signal is over 3T from the previous turning point, the reset signal M_A is set to H. FIG. 8 shows the waveforms of various control signals and the EFMI signal.

Figure 7:
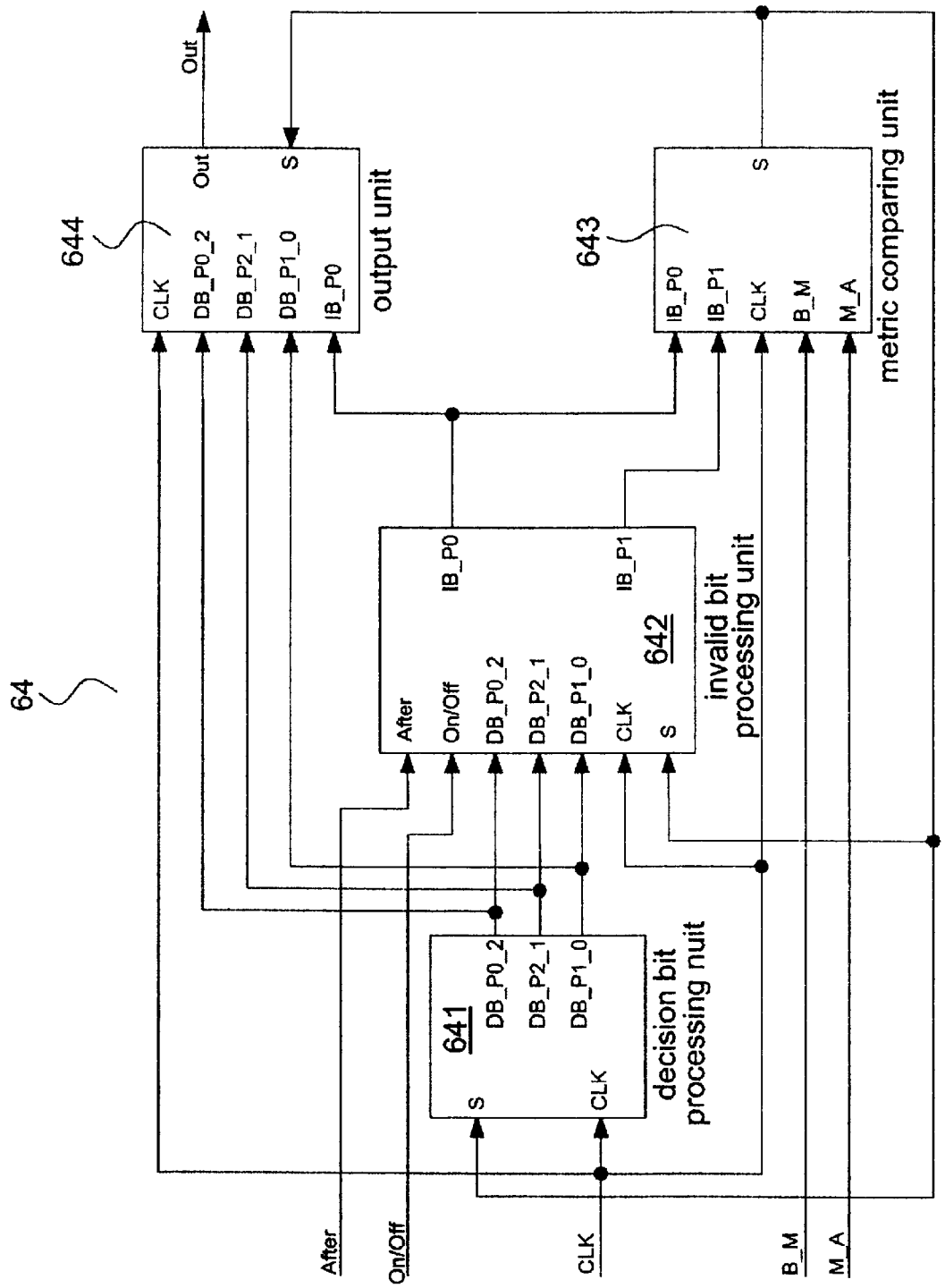
FIG. 7 is a block diagram showing the operation unit in FIG. 6.

The operation unit 64 computes the output value according to the control signals After, On/Off, M_A, and the metric B_M outputted from the metric computing unit 62. FIG. 7 is a block diagram showing the operation unit 64. Referring to FIG. 7, the operation unit 64 includes a decision bit processing unit 641, an invalid bit processing unit 642, a metric comparing unit 643, and an output unit 644.

The decision bit processing unit 641 decides the decision bits DB_P0_2, DB_P2_1, and DB_P1_0 when data are transferred among the state processors P0, P1 and P2. The decision bits DB_P0_2, DB_P2_1 and DB_P1_0 are outputted to the invalid bit processing unit 642 and the output unit 644. The decision bit DB of the state processor P0 is reversed to generate the decision bit DB_P0_2. The decision bit DB of the state processor P2 is outputted as a decision bit DB_P2_1. The decision bit DB_P1_0 selects the decision bit DB of the state processor P0 or state processor P1 according to the selection signal S.

The invalid bit processing unit 642 generates the invalid bits IB for the state processors P0, P1 and P2. The decision rule for the invalid bit of each state processor P0 is described as follows.

The conditions where the invalid bit IB_P0 of the state processor P0 is H include: when the signal "After" is H, the selection signal S selects the state processor P0; the selection signal S selects the state processor P0 and the invalid bit of the state processor P0 is H; the selection signal S selects the state processor P1 and the invalid bit of the state processor P1 is H; or the selection signal S selects the state processor P1, and when the signal "After" is H, the decision bit DB_P0_2 is opposite to the decision bit DB_P1_0.

The conditions where the invalid bit IB_P1 of the state processor P1 is H include: the invalid bit IB_P2 of the state processor P2 is H; or when the signal "After" is H, the decision bit DB_P0_2 is opposite to the decision bit DB_P2_1.

The conditions where the invalid bit IB_P2 of the state processor P2 is H include: the invalid bit IB_P0 of the state processor P0 is H; or the switching signal On/Off is L.

The metric comparing unit 643 generates the selection signal S according to the invalid bits IB_P0 and B_P1 of the state processors P0 and P1 and the metrics. When both of the invalid bits IB_P0 and IB_P1 of the state processors P0 and P1 are L, the state processors P0 and P1 having a smaller metric is selected as the survivor. When one of the invalid bits IB_P0 and IB_P1 of the state processors P0 and P1 is H, the state processor having an invalid bit of L is selected as the survivor. The output unit 644 outputs the content of the state processor.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A circuit for protecting the minimum run length in RLL code, the circuit operating in before, turning, and after states of an EFM signal to protect the minimum run length in RLL code, the circuit comprising:

three state processors, each of which including a decision bit, an invalid bit, a metric bit, and a path bit array, and operating according the three states of before, turning and after, respectively;

a metric computing unit for computing metrics of the EFM signal with respect to the three states of before, turning and after;

a timing control unit for generating control signals that are transferred to the three state processors and the metric computing unit according to the EFM signal; and an operation unit for controlling the decision bit, the invalid bit, the metric bit, and the path bit array of the state processors, and generating correct output signals according to the control signals from the timing control unit and the metrics of the three states from the metric computing unit.

2. The circuit according to claim 1, wherein the control signals include a "before" signal, a "turning" signal, an "after" signal, a switching signal, and a reset signal.

3. The circuit according to claim 2, wherein the reset signal is enabled when a turning point of the EFM signal is over 4T from a previous turning point, so as to reset the metric bits of the three state processors and to prevent the comparison result before the turning point from being influenced by that after the turning point.

4. The circuit according to claim 2, wherein the operation unit utilizes a comparator to compare the metric of the state processor P0 to that of the state processor P1, and a selection signal S is set to be 1 when the metric of the state processor P1 is greater then the metric of the state processor P0, and is set to 0 otherwise.

5. The circuit according to claim 4, wherein the conditions where the invalid bit of the state processor P0 is enabled by the operation unit are:

the "after" signal is enabled and the selection signal S is 0;

the selection signal S is 0, and the invalid bit of the state processor P0 is H;

the selection signal S is 1, and the invalid bit of the state processor P1 is H; and the selection signal S is 1, and when the signal after turning is H, the decision bit of the state processor P0 is opposite to the decision bit of the state processor P1.

6. The circuit according to claim 5, wherein the conditions where the invalid bit of the state processor P1 is enabled by the operation unit are:

the invalid bit of the state processor P2 is H; and when the "after" signal is H, the decision bit of the state processor P0 is opposite to the decision bit of the state processor P2.

7. The circuit according to claim 6, wherein the conditions where the invalid bit of the state processor P2 is enabled by the operation unit are:

the invalid bit of the state processor P0 is H; and the switching signal is L.

8. The circuit according to claim 7, wherein the operation unit is configured such that:

data from the state processor P0 are transferred to the state processor P2;

data from the state processor P2 are transferred to the state processor P1;

data from the state processor P0 are transferred to the state processor P0 when the selection signal is 0; and data from the state processor P1 are transferred to the state processor P0 when the selection signal is 1.

9. The circuit according to claim 8, wherein the decision bit DB is changed only when the data are transferred from the state processor P0 to the state processor P2, the decision bit DB is set to be 1 when B to T is performed, and to be 0 when T to B is performed.

10. The circuit according to claim 2, wherein the metric computing unit samples the EFM signal using a sampling clock having a frequency higher than the sampling frequency of the EFM signal, and computes in conjunction with standard signals of the three states of before, turning and after, in order to generate the metrics of three states of before, turning and after.

11. The circuit according to claim 10, wherein the frequency of the sampling clock equals to four times of the sampling frequency of the EFM signal.

12. The circuit according to claim 11, wherein the standard signals of the three states of before, turning and after are "001111111111", "000000111111", and "000000000011", respectively.

* * * * *